United States Patent
Cheng et al.

(10) Patent No.: US 11,203,083 B2
(45) Date of Patent: Dec. 21, 2021

(54) METHOD FOR FABRICATING MICROFLUIDIC DEVICES IN FUSED SILICA BY PICOSECOND LASER IRRADIATION

(71) Applicant: East China Normal University, Shanghai (CN)

(72) Inventors: Ya Cheng, Shanghai (CN); Jian Xu, Shanghai (CN); Xiaolong Li, Shanghai (CN)

(73) Assignee: East China Normal University, Shanghai (CN)

( * ) Notice: Subject to any disclaimer, the term of this patent is extended or adjusted under 35 U.S.C. 154(b) by 294 days.

(21) Appl. No.: 16/377,138

(22) Filed: Apr. 5, 2019

(65) Prior Publication Data
US 2020/0189028 A1   Jun. 18, 2020

(30) Foreign Application Priority Data
Dec. 17, 2018   (CN) .......................... 201811539810.9

(51) Int. Cl.
| | |
|---|---|
| *B23K 26/0622* | (2014.01) |
| *B23K 26/064* | (2014.01) |
| *B01L 3/00* | (2006.01) |
| *B81C 1/00* | (2006.01) |

(52) U.S. Cl.
CPC .... *B23K 26/0624* (2015.10); *B01L 3/502707* (2013.01); *B23K 26/064* (2015.10); *B81C 1/00539* (2013.01)

(58) Field of Classification Search
CPC .............. B23K 26/0624; B23K 26/064; B01L 3/502707; B81C 1/00539; B81C 1/00119
See application file for complete search history.

(56) References Cited

U.S. PATENT DOCUMENTS

2017/0158551 A1*  6/2017  Bookbinder ........... B23K 26/50

FOREIGN PATENT DOCUMENTS

CN           106041313 A     10/2016

OTHER PUBLICATIONS

ABL2000 Series Stage User's Manual, Aerotech, Inc, pp. 1-46; (Year: 2011).*

(Continued)

*Primary Examiner* — Binh X Tran
(74) *Attorney, Agent, or Firm* — Mei & Mark LLP; Manni Li

(57) ABSTRACT

Method of fabricating a microfluidic device by means of inducing internal cracks in fused silica employing a picosecond laser beam, firstly utilizing irradiation of a focused temporally controlled picosecond laser beam in fused silica to generate a spatially selective modification region including randomly oriented nanocracks, then employing chemical etching to remove the irradiated area and obtain a hollow and connected three-dimensional microstructure, thereby achieving three-dimensional fabrication of microchannel structures inside the fused silica. The method can realize polarization insensitive three-dimensional uniform etching by regulating the pulse width of the picosecond laser beam, and has high chemical etch rate and selectivity, applicable for fabrication of large-sized three-dimensional microfluidic systems, high-precision 3D glass printing, etc.

7 Claims, 6 Drawing Sheets

(56) References Cited

OTHER PUBLICATIONS

C. Hnatovsky, et al., "Polarization-selective etching in femtosecond laser-assisted microfluidic channel fabrication in fused silica," Optics Letters, vol. 30, No. 14, pp. 1867-1869 (Jul. 15, 2005).
M. Hermans, et al., "Selective, laser-induced etching of fused silica at high scan-speeds using KOH," Journal of Laser Micro/Nanoengineering, vol. 9, No. 2, pp. 126-131 (2014).
X. M. Yu, et al., "Tuning etch selectivity of fused silica irradiated by femtosecond laser pulses by controlling polarization of the writing pulses," Journal of Applied Physics, vol. 109, 053114-1 to 053114-15 (2011).

\* cited by examiner

METHOD FOR FABRICATING MICROFLUIDIC DEVICES IN FUSED SILICA BY PICOSECOND LASER IRRADIATION

CROSS-REFERENCE TO RELATED APPLICATION

The subject application claims priority on Chinese patent application CN201811539810.9 filed on Dec. 17, 2018 in China. The contents and subject matter of the Chinese priority application is incorporated herein by reference.

FIELD OF INVENTION

The present invention relates to method for fabricating a three-dimensional microchannel and microfluidic device, particularly, a method for fabricating a microfluidic device in fused silica using picosecond laser irradiation, which is applicable for fabrication of large-sized glass-based microfluidic systems, high-precision 3D glass printing, etc.

BACKGROUND OF INVENTION

Microfluidic chip technology is a revolutionary technology that has shown important applications in chemical synthesis and analysis, biopharmaceuticals, medical diagnostics, photonics, etc. A microchannel is the core unit of a microfluidic chip, and its high performance and multifunction fabrication technology are of great significance for promoting the development of microfluidic chip technology. Compared with a two-dimensional microchannel that is popular now, a three-dimensional microchannel provides more flexibility and efficiency in the micro-scale spatial fluid handling capabilities for further innovation in the microfluidic chip technology.

Fused silica is one of the widely used substrates for the microfluidic chip technology due to its high melting point, chemical stability, low thermal expansion coefficient, wide transmission spectral range, and good biocompatibility. The most representative technique currently used for fabricating a three-dimensional microchannel in fused silica is femtosecond laser three-dimensional microfabrication. By regulating the pulse energy of a focused femtosecond laser beam, highly nonlinear modification such as nano-gratings and micro-voids can be induced inside fused silica, and a microchannel structure with a flexible and controllable three-dimensional configuration can be fabricated in different ways. In the technique, the use of femtosecond laser beam irradiation to induce polarization-dependent selective chemical etching is one of the most widely studied and most promising technological approaches. By adjusting the polarization of the focused linearly polarized femtosecond laser beam until perpendicular to the laser direct writing direction, etch rate can be greatly increased (See C. Hnatovsky, et al., Opt. Lett. 2005, 30, 1867-1869; M. Hermans, et al., J. Laser Micro Nanoeng. 2014, 9, 126-131). However, when employing the approach to fabricate a three-dimensional microchannel, different spatial orientations of the feature structure can cause a large difference in the etch rate, which affects the fabrication effect of the microchannel structure, generating a cone-shaped three-dimensional microchannel for instance. With a circularly polarized light, though three-dimensional uniform etching can be achieved (see X. M. Yu, et al., J. Appl. Phys. 2011, 109, 053114), the etch rate is greatly reduced with respect to linearly polarized light, unfavorable for high-performance controllable fabrication of a microchannel. A higher etch rate can be obtained by real-time transformation of the polarization of the laser beam as the direct writing direction changes during the irradiation process, but it increases the complexity of the processing system and procedures. Therefore, it is of great significance to seek a simple and controllable method for fabricating a three-dimensional fused silica microchannel with good three-dimensional uniformity.

SUMMARY OF INVENTION

The present invention overcomes shortcomings of the existing technology in fabricating a three-dimensional microchannel employing a femtosecond laser beam, thus provides a simple, controllable, and three-dimensional controllable method for fabricating a fused silica microchannel and a microfluidic device.

The present invention provides a method for fabricating a microfluidic device by means of inducing internal cracks in fused silica employing a picosecond laser beam, comprising the following steps:

Step 1: Picosecond Laser Beam Irradiation fixing a glass sample of fused silica on a programmable three-dimensional positioning stage, focusing a temporally-controlled picosecond laser beam on the sample via a microscope objective, driving the positioning stage and starting picosecond laser beam irradiation simultaneously, directly writing a required three-dimensional microchannel pattern containing randomly oriented nanocracks inside the fused silica;

Step 2: Selective Chemical Etching placing the glass sample irradiated by the picosecond laser beam in a chemical etching solution, and performing spatial selective etching removal on the directly written three-dimensional microchannel pattern, thereby obtaining a microchannel structure inside the sample possessing a three-dimensional geometrical hollow configuration.

In the present invention, the temporally controlled laser beam has a pulse width of 1-20 ps, a repetition rate of 1-1000 kHz, and the microscope objective has a numerical aperture of 0.1-1.4.

In the present invention, the chemical etching solution is 5-20 mol/L potassium hydroxide solution or 1-20% hydrofluoric acid solution at 80-95° C.

The advantages of the present invention are:

1. Polarization insensitivity to processing light. Temporally controlled picosecond laser beam processing produces a region of randomly oriented nanocracks different from the conventional nano-grating structures, and there is little difference among the chemical etch rates of circularly polarized light and linearly polarized light with different polarizations, meaning the polarization dependence is greatly reduced compared with femtosecond laser beam-assisted chemical etching of a microchannel. The polarization insensitivity helps improve the controllability of chemical etching process, favorable for fabricating a high-fidelity three-dimensional microchannel and a three-dimensional intracavity structure with a complex surface.

2. High etch rate. Due to the randomly oriented nanocracks formed in the nonlinear interaction between the temporally controlled picosecond laser beam and fused silica, the etching solution is more likely to enter these cracks, causing rapid connection thereof and accelerating the whole etching process to an extent comparable to the fastest etch rate of the femtosecond laser micromachining method.

3. Three-dimensional controllable fabrication. Although picosecond laser beam causes more energy deposition during interaction with fused silica than femtosecond laser beam and generates relatively large thermal stresses, which affects the microchannel fabrication effect, regulating the picosecond laser beam irradiation parameters such as pulse width, irradiation energy, and irradiation time can effectively control the generation of randomly oriented nanocracks inside the fused silica, thus achieving controllable fabrication of a three-dimensional microchannel.

BRIEF DESCRIPTION OF THE DRAWINGS

In FIG. 2, reference letter "a" indicates linear polarization with orientation perpendicular to the direct writing, and reference letter "b" indicates circular polarization which is produced by employing a quarter-wave plate prior to the objective.

In FIG. 3, reference letter "a" indicates linear polarization with orientation perpendicular to the direct writing, and reference letter "b" indicates circular polarization which is produced by employing a quarter-wave plate prior to the objective.

DETAILED DESCRIPTION OF INVENTION AND EMBODIMENTS

The present invention is expounded in more details with the figures and embodiments hereunder provided, which by no means serve to limit the scope of the present invention.

Embodiment 1

In the first embodiment of the present invention, the method comprises the following steps:

Step 1: Picosecond Laser Beam Irradiation

Figure 1:
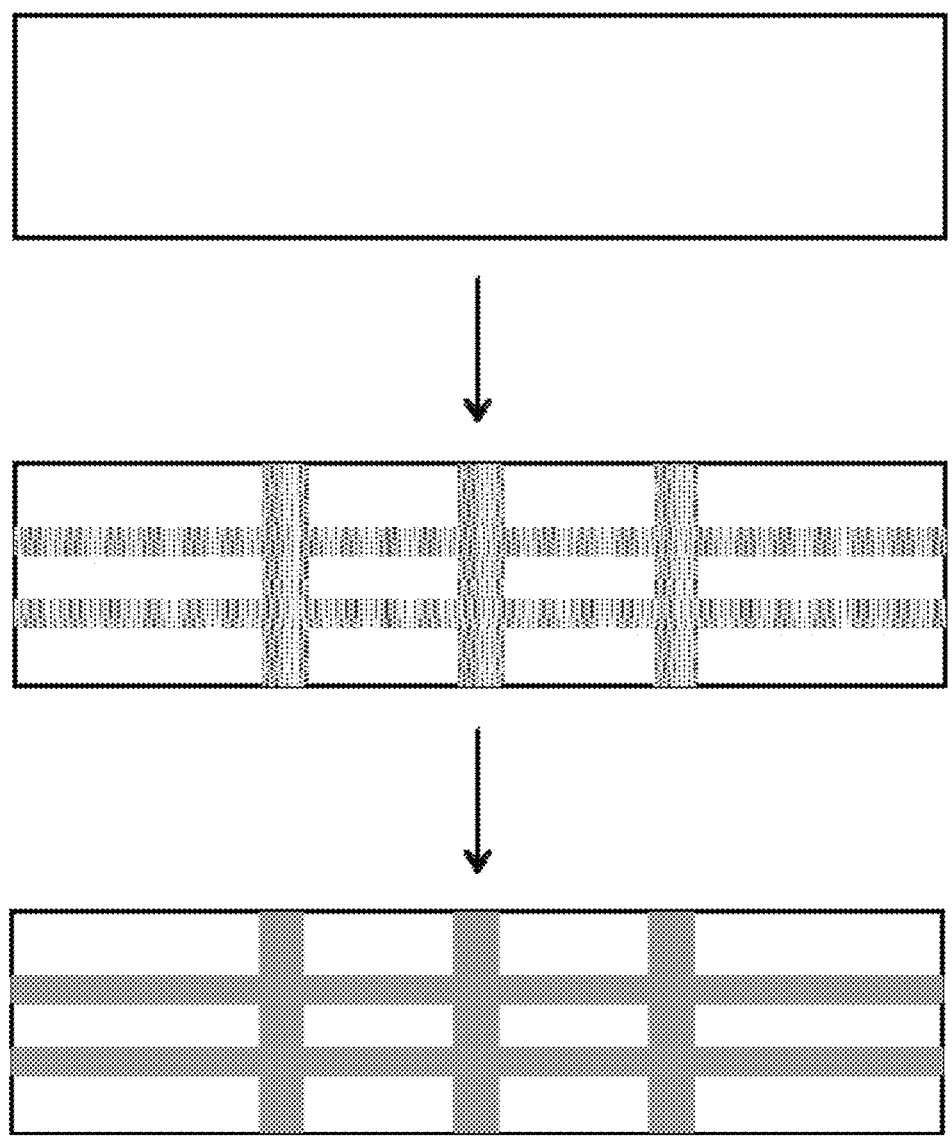
FIG. 1 is a schematic flow chart showing the method for fabricating a microfluidic device by inducing randomly oriented nanocracks in fused silica employing a picosecond laser beam in the present invention.
Figure 2:
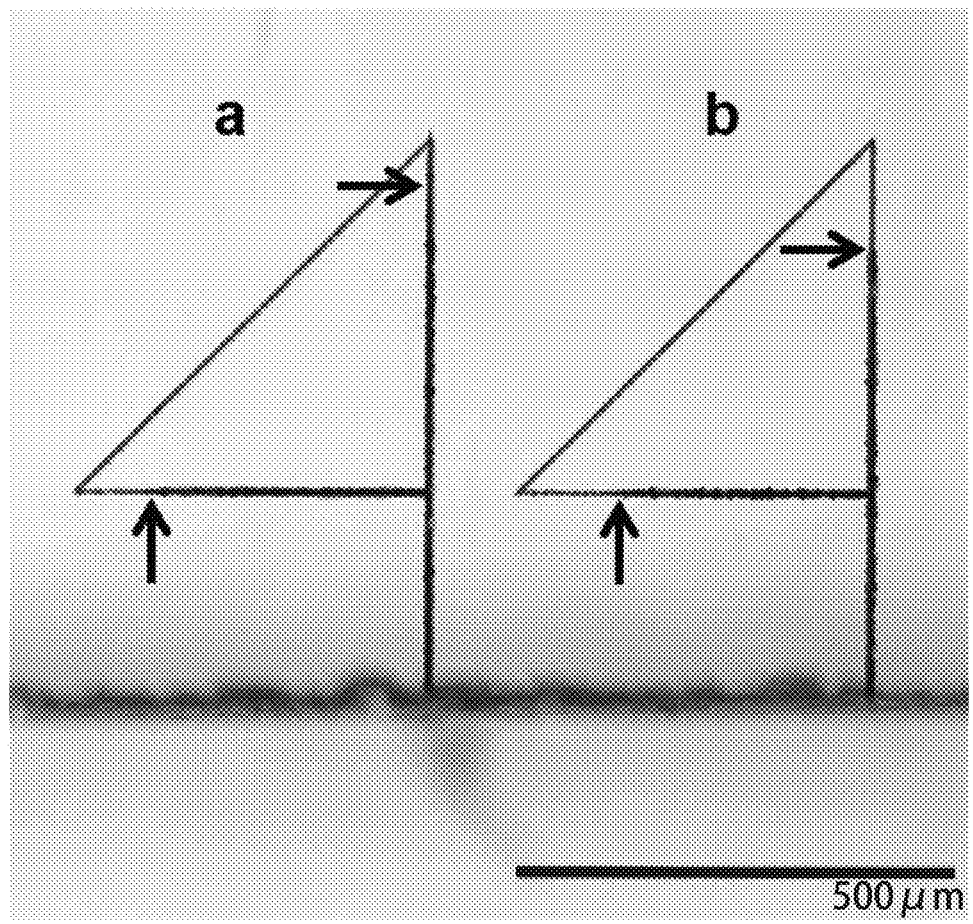
FIG. 2 is an optical microscope image showing the 1 h chemical etching results of laser modified tracks using 8 ps laser irradiation with two different polarization states in the present invention.
Figure 3:
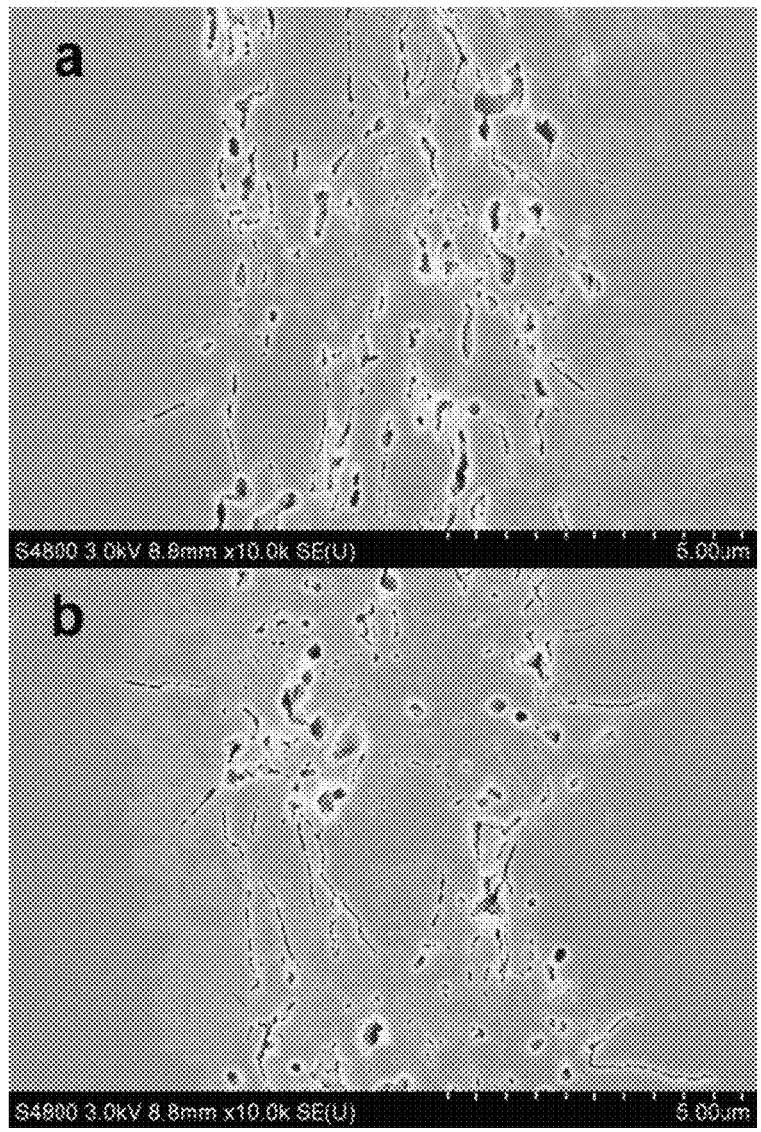
FIG. 3 is scanning electron microscope images of generated nanocracks in laser-modified regions using 8 ps laser irradiation with two different polarization states in the present invention.

As shown in FIG. 1, fixing a clean glass sample of fused silica with a size of 20 mm×10 mm×2 mm and polished on six sides on a three-dimensional positioning stage; the laser operating at a center wavelength of 1026 nm, with a repetition rate of 50 kHz and a pulse width of 8 ps; focusing the laser beam at a depth of 300 μm below the surface of the glass substrate using a microscope objective with a numerical aperture of 0.45 (transmission rate is ~30% for the beam). To evaluate the effect of polarization on the etch rate, two different polarization states of the output laser beam are used to directly write the patterns: linear polarization with orientation perpendicular to the direct writing direction (marked with "a" in FIG. 2 and FIG. 3), circular polarization which is produced by employing a quarter-wave plate prior to the objective (marked with "b" in FIG. 2 and FIG. 3); the pulse energy prior to the objective and the scanning speed are 8 μJ and 0.5 mm/s, respectively. Randomly oriented nanocracks in laser-modified regions with two different polarization states can be both identified from scanning electron microscope images shown in FIG. 3.

Step 2: Selective Chemical Etching

Placing the glass sample irradiated by the picosecond laser beam in a 10 mol/L potassium hydroxide solution (85° C.) for ultrasonic assisted etching for 1 h, and then taking the sample out for observation. It can be seen from the comparison of etching states shown in FIG. 2 (arrows show the etched terminals of laser-modified traces, indicating the etched lengths along the horizontal and vertical segments in the regions of the triangle loops) that under the same condition, there is little difference among the etch rates of the samples irradiated by the 8 ps laser beam with different polarization states and orientations of segments (i.e. polarization insensitive). Moreover, all etch rates along the segments are higher than 500 μm/h.

Embodiment 2

In the second embodiment of the present invention, the method comprises the following steps:

Step 1: Picosecond Laser Beam Irradiation

As shown in FIG. 1, fixing a clean glass sample of fused silica with a size of 5 mm×5 mm×5 mm and polished on six sides on a three-dimensional positioning stage; the laser operating at a center wavelength of 1026 nm, with a repetition rate of 50 kHz and a pulse width of 8 ps; focusing the light beam via a microscope objective with a numerical aperture of 0.30 (transmission rate is ~50% for the beam), placing a quarter-wave plate before the microscope objective to generate a circularly polarized beam, writing a six-sided microchannel multilayer grid pattern inside the glass sample. The pulse energy prior to the objective and the scanning speed are 9 μJ and 0.5 mm/s, respectively.

Step 2: Selective Chemical Etching

Figure 4:
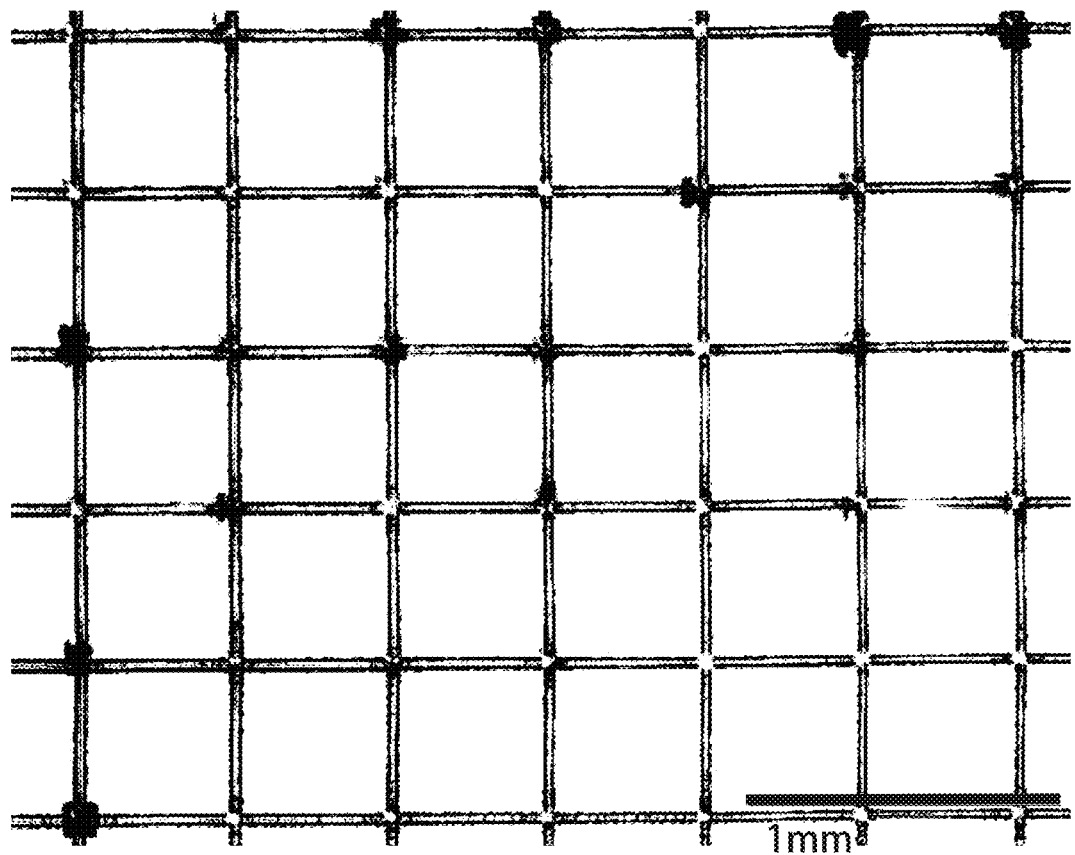
FIG. 4 is a front-view optical micrograph of a three-dimensional multi-layer network microchannel structure fabricated by 8 ps laser irradiation followed by chemical etching in the present invention.

Placing the glass sample irradiated by picosecond laser beam in a 10 mol/L potassium hydroxide solution (85° C.) for ultrasonic assisted etching until the laser beam irradiated region is completely removed, forming a three-dimensional hollow multi-layer network microchannel structure (as shown in the front view in FIG. 3 and the side view in FIG. 4) inside the glass sample. The etching of the channels is uniform without obvious tapered structure.

Embodiment 3

In the third embodiment of the present invention, the method comprises the following steps:

Step 1: Picosecond Laser Beam Irradiation

Fixing a clean glass sample of fused silica with a size of 5 mm×5 mm×1 mm and polished on six sides on a three-dimensional positioning stage; the laser operating at a center wavelength of 1026 nm, with a repetition rate of 50 kHz and a pulse width of 10 ps; focusing the light beam via a microscope objective with a numerical aperture of 0.45 (transmission rate is ~30% for the beam), placing a quarter-wave plate before the microscope objective to generate a circularly polarized beam, writing a three-dimensional microcoil pattern with a coil diameter of 200 μm and a period of 150 μm inside the glass sample. The pulse energy prior to the objective and the scanning speed are 4 μJ and 0.5 mm/s, respectively.

Step 2: Selective Chemical Etching

Figure 5:
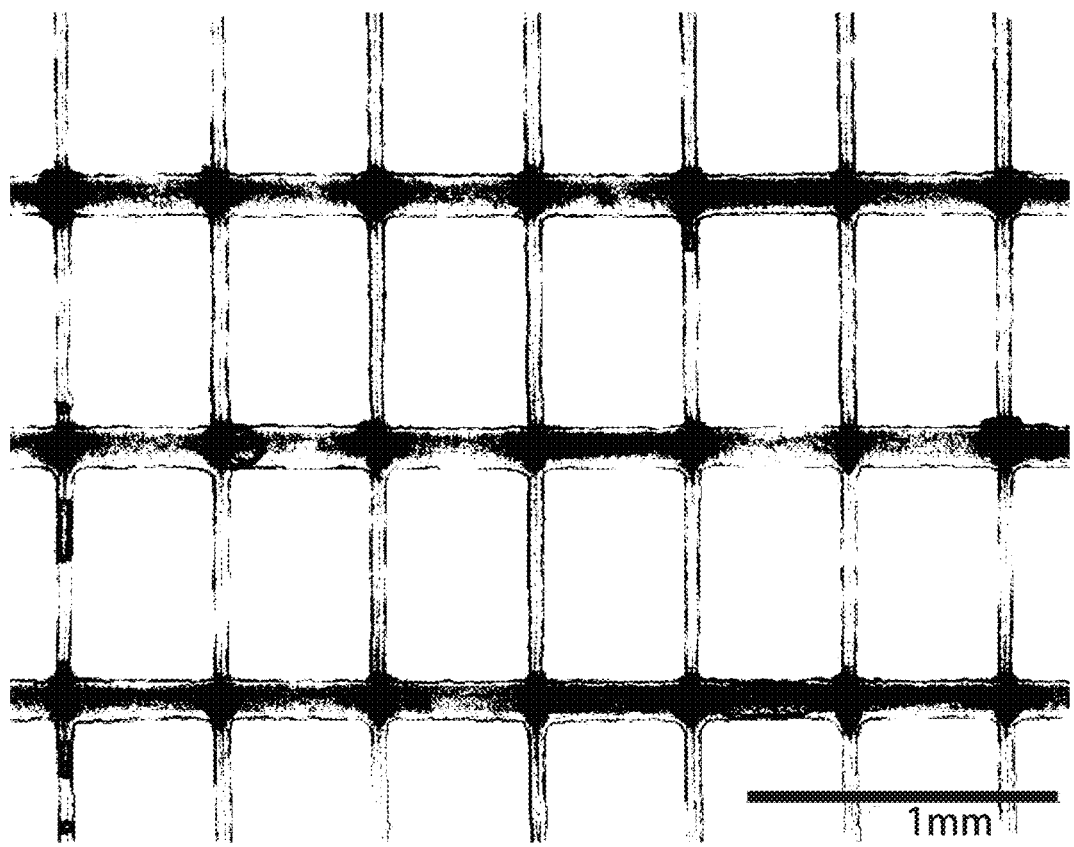
FIG. 5 is a side-view optical micrograph of the three-dimensional multi-layer network microchannel structure fabricated by 8 ps laser irradiation followed by chemical etching in the present invention.
Figure 6:
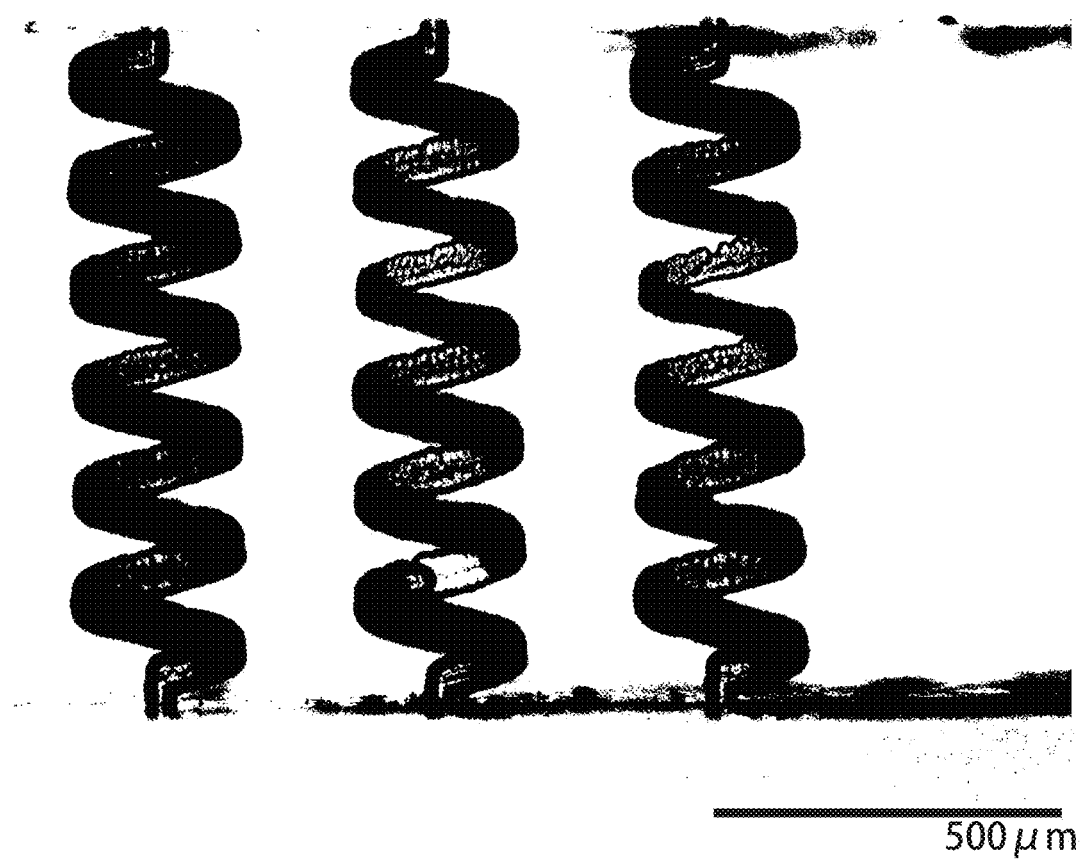
FIG. 6 is a side-view optical micrograph of a three-dimensional microcoil channel structure fabricated by 10 ps laser irradiation followed by chemical etching in the present invention.

Placing the glass sample irradiated by picosecond laser beam in a 10 mol/L potassium hydroxide solution (85° C.) for ultrasonic assisted etching until the laser beam irradiated region is completely removed, forming a three-dimensional microcoil channel structure (as shown in FIG. 5) inside the glass sample. The etching of the channels is uniform without obvious tapered structure.

We claim:

1. A method for fabricating a microfluidic device, comprising:
   (1) fixing a glass sample of fused silica on a programmable three-dimensional positioning stage, focusing a laser beam on the glass sample via a microscope objective, wherein the laser beam is in a polarization state that is linearly polarized or circular polarized, driving the programmable three-dimensional positioning stage and starting irradiation with the linearly polarized or circular polarized laser beam simultaneously, and directly writing a pattern for forming a three-dimensional microchannel by inducing randomly oriented nanocracks within the three-dimensional microchannel pattern inside the fused silica, wherein the laser beam is temporally controlled and has a pulse width of 8 to 20 picoseconds; and
   (2) placing the glass sample irradiated by the laser beam in a chemical etching solution, and performing spatial selective etching removal to obtain a microchannel inside the fused silica sample possessing a three-dimensional geometric configuration, wherein rate of etching is insensitive to the polarization state and orientation of the laser beam.

2. The method of claim 1, wherein the laser beam has a repetition rate of 1-1000 kHz, and the microscope objective has a numerical aperture of 0.1-1.4.

3. The method of claim 1, wherein the chemical etching solution is a potassium hydroxide solution at a concentration of 5 mol/L to 20 mol/L at 80-95° C.

4. The method of claim 1, wherein the chemical etching solution is a hydrofluoric acid solution at a concentration of 1% to 20% (volume percentage).

5. The method of claim 1, wherein the laser beam is linearly polarized, circularly polarized, or both, before being focused and irradiating on the glass sample.

6. The method of claim 1, wherein the three-dimensional microchannel pattern inside the fused silica is a three-dimensional multi-layer network microchannel structure.

7. The method of claim 1, wherein the three-dimensional microchannel pattern inside the fused silica is a three-dimensional microcoil channel structure.

* * * * *